(12) United States Patent
Fluit

(10) Patent No.: US 11,915,960 B2
(45) Date of Patent: Feb. 27, 2024

(54) VERTICAL BATCH FURNACE ASSEMBLY

(71) Applicant: ASM IP Holding B.V., Almere (NL)

(72) Inventor: Jeroen Fluit, Amsterdam (NL)

(73) Assignee: ASM IP Holding B.V., Almere (NL)

( * ) Notice: Subject to any disclaimer, the term of this patent is extended or adjusted under 35 U.S.C. 154(b) by 500 days.

(21) Appl. No.: 16/935,288

(22) Filed: Jul. 22, 2020

(65) Prior Publication Data
US 2021/0035841 A1 Feb. 4, 2021

Related U.S. Application Data

(60) Provisional application No. 62/880,946, filed on Jul. 31, 2019.

(51) Int. Cl.
| | |
|---|---|
| *H01L 21/677* | (2006.01) |
| *H01L 21/67* | (2006.01) |
| *H01L 21/673* | (2006.01) |
| *B65G 1/04* | (2006.01) |
| *F27B 17/00* | (2006.01) |
| *F27D 3/12* | (2006.01) |
| *F27D 3/00* | (2006.01) |
| *F27D 15/02* | (2006.01) |

(52) U.S. Cl.
CPC ........ *H01L 21/67757* (2013.01); *B65G 1/045* (2013.01); *F27B 17/0025* (2013.01); *F27D 3/0084* (2013.01); *F27D 3/12* (2013.01); *F27D 15/02* (2013.01); *H01L 21/67109* (2013.01); *H01L 21/67303* (2013.01); *B65G 2201/0297* (2013.01); *F27D 2003/0051* (2013.01); *F27D 2003/0087* (2013.01)

(58) Field of Classification Search
CPC ........ H01L 21/67757; H01L 21/67303; B65G 2201/0297
See application file for complete search history.

(56) References Cited

U.S. PATENT DOCUMENTS

| | | | | |
|---|---|---|---|---|
| 5,407,449 | A * | 4/1995 | Zinger | H01L 21/67769 414/935 |
| 6,632,068 | B2 * | 10/2003 | Zinger | H01L 21/67386 414/800 |
| 2002/0099470 | A1 * | 7/2002 | Zinger | H01L 21/67757 700/228 |
| 2002/0197145 | A1 * | 12/2002 | Yamamoto | C23C 16/4401 118/724 |

(Continued)

*Primary Examiner* — Kaitlin S Joerger
(74) *Attorney, Agent, or Firm* — Snell & Wilmer L.L.P.

(57) ABSTRACT

A vertical batch furnace assembly for processing wafers comprising a cassette handling space, a wafer handling space, and an internal wall separating the cassette handling space and the wafer handling space. The cassette handling space is provided with a cassette storage configured to store a plurality of wafer cassettes. The cassette handling space is also provided with a cassette handler configured to transfer wafer cassettes between the cassette storage and a wafer transfer position. The wafer handling space is provided with a wafer handler configured to transfer wafers between a wafer cassette in the wafer transfer position and a wafer boat. The internal wall is provided with a wafer transfer opening adjacent the wafer transfer position for a wafer cassette from or to which wafers are to be transferred. The cassette storage comprises a cassette storage carousel with a diameter between 1.1 and 1.6 meter.

11 Claims, 4 Drawing Sheets

(56) References Cited

U.S. PATENT DOCUMENTS

| | | | | |
|---|---|---|---|---|
| 2014/0148924 A1* | 5/2014 | Brak | ............... | H01L 21/67313 |
| | | | | 700/12 |
| 2015/0099235 A1* | 4/2015 | Watanabe | ......... | H01L 21/67248 |
| | | | | 432/32 |
| 2016/0211157 A1* | 7/2016 | Inoshima | .......... | H01L 21/68757 |
| 2019/0304821 A1* | 10/2019 | Pierreux | ........... | H01L 21/30604 |
| 2020/0168485 A1* | 5/2020 | Fluit | ................... | H01L 21/6773 |
| 2020/0168491 A1* | 5/2020 | Miyada | ............. | H01L 21/67288 |
| 2020/0270752 A1* | 8/2020 | Pierreux | ........... | C23C 16/45553 |
| 2020/0312631 A1* | 10/2020 | Marubayashi | .... | H01J 37/32449 |
| 2020/0411335 A1* | 12/2020 | Hirotani | ............ | H01L 21/67196 |
| 2022/0199444 A1* | 6/2022 | Oosterlaken | ...... | H01L 21/67778 |

\* cited by examiner

VERTICAL BATCH FURNACE ASSEMBLY

CROSS-REFERENCE TO RELATED APPLICATIONS

This application claims priority to U.S. Provisional Patent Application Ser. No. 62/880,946 filed Jul. 31, 2019 titled VERTICAL BATCH FURNACE ASSEMBLY, the disclosure of which is hereby incorporated by reference in its entirety.

FIELD OF THE DISCLOSURE

The present disclosure generally relates to a vertical batch furnace assembly for processing wafers.

BACKGROUND

Vertical batch furnace assemblies may comprise a cassette handling space provided with a cassette storage for storing a plurality of wafer cassettes. The cassette storage may comprise a cassette storage carousel and an associated cassette handler. The cassette handler can place a cassette on a platform stage of the associated cassette storage carousel. The number of platform stages in the cassette storage carousel, and the number of wafer cassettes which can be stored on a single platform stage, may vary depending on the design.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object to provide a vertical batch furnace assembly with an improved storing capacity.

To that end, there may be provided a vertical batch furnace assembly. More particularly, there may be provided a vertical batch furnace assembly for processing wafers.

The vertical batch furnace assembly may comprise a cassette handling space. The cassette handling space may be provided with a cassette storage configured to store a plurality of wafer cassettes provided with a plurality of wafers. The cassette handling space may be provided with a cassette handler configured to transfer wafer cassettes between the cassette storage and a wafer transfer position. The vertical batch furnace assembly may comprise a wafer handling space. The wafer handling space may be provided with a wafer handler configured to transfer wafers between a wafer cassette in the wafer transfer position and a wafer boat in a wafer boat transfer position. The vertical batch furnace assembly may comprise an internal wall separating the cassette handling space and the wafer handling space. The internal wall may be provided with a wafer transfer opening adjacent the wafer transfer position for a wafer cassette from or to which wafers are to be transferred. The cassette storage may comprise a cassette storage carousel with a diameter between 1.1 and 1.6 meter.

An advantage of having a cassette storage carousel with a diameter between 1.1 and 1.6 meter is that the cassette storage carousel may be extending over the full width of the tool and in this way may accommodate a large number of cassettes.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art may recognize that the invention may be embodied or carried out in a manner that achieves or optimizes one advantage or group of advantages as taught or suggested herein without necessarily achieving other objects or advantages as may be taught or suggested herein.

Various embodiments are claimed in the dependent claims, which will be further elucidated with reference to an example shown in the figures. The embodiments may be combined or may be applied separate from each other.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF THE FIGURES

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments by referring to the example shown in the figures.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "wafer" may refer to any underlying material or materials that may be used, or upon which, a device, a circuit, or a film may be formed.

Figure 1:
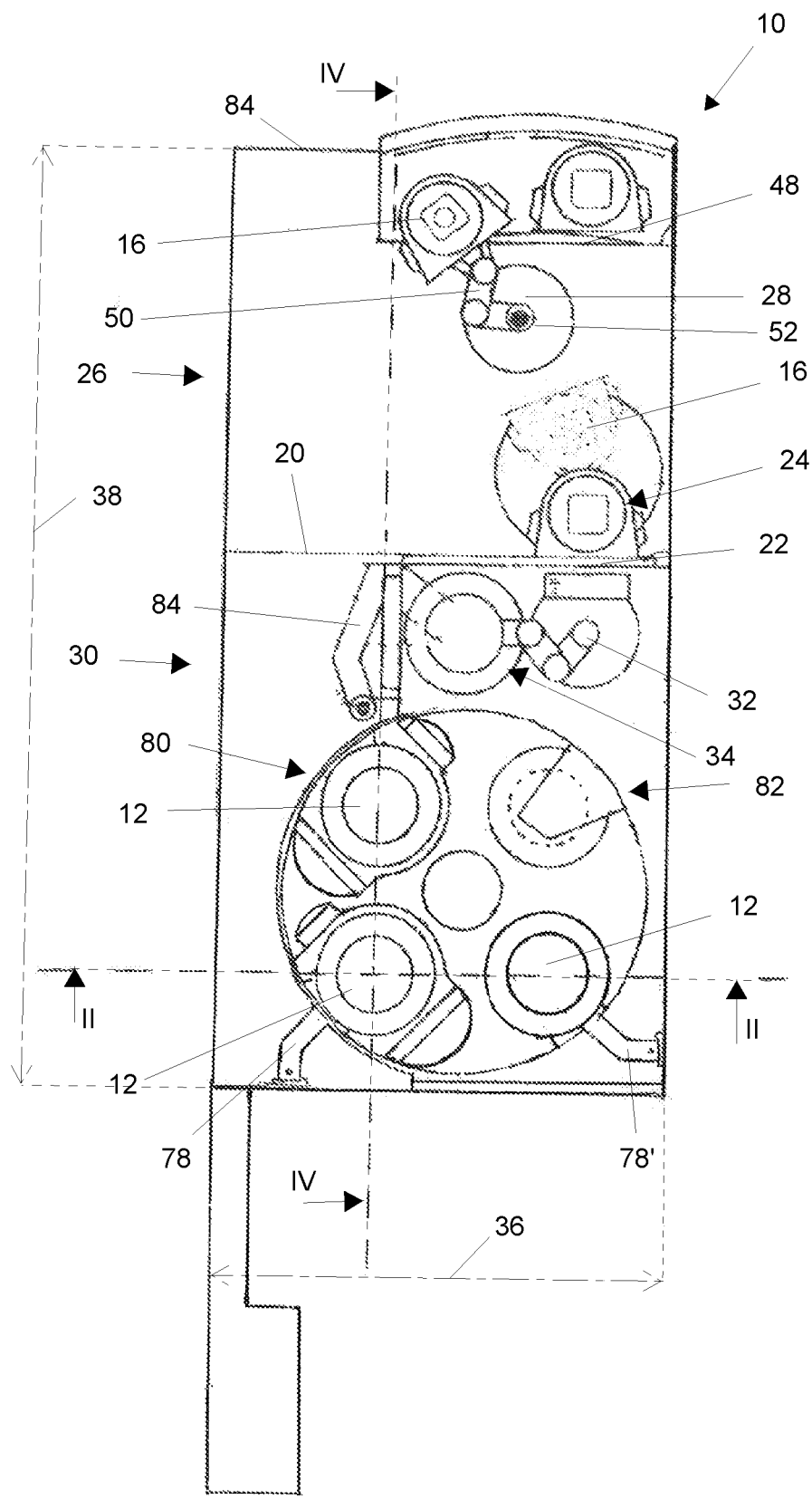
FIG. 1 shows a schematic top view of an example of a vertical batch furnace assembly.
Figure 2:
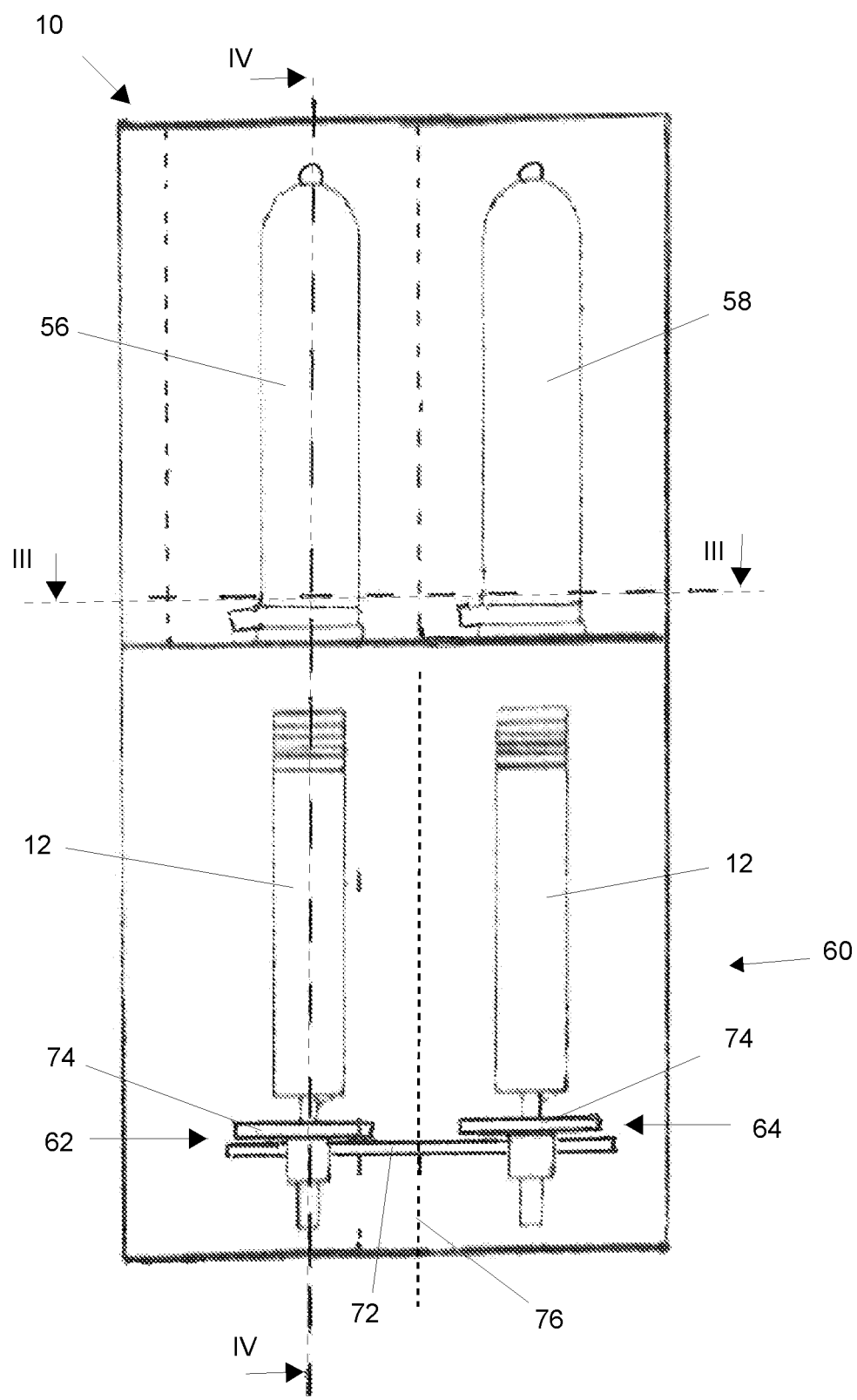
FIG. 2 shows a schematic cross section of the example of FIG. 1, along the lines II in FIGS. 1, 3, and 4.
Figure 3:
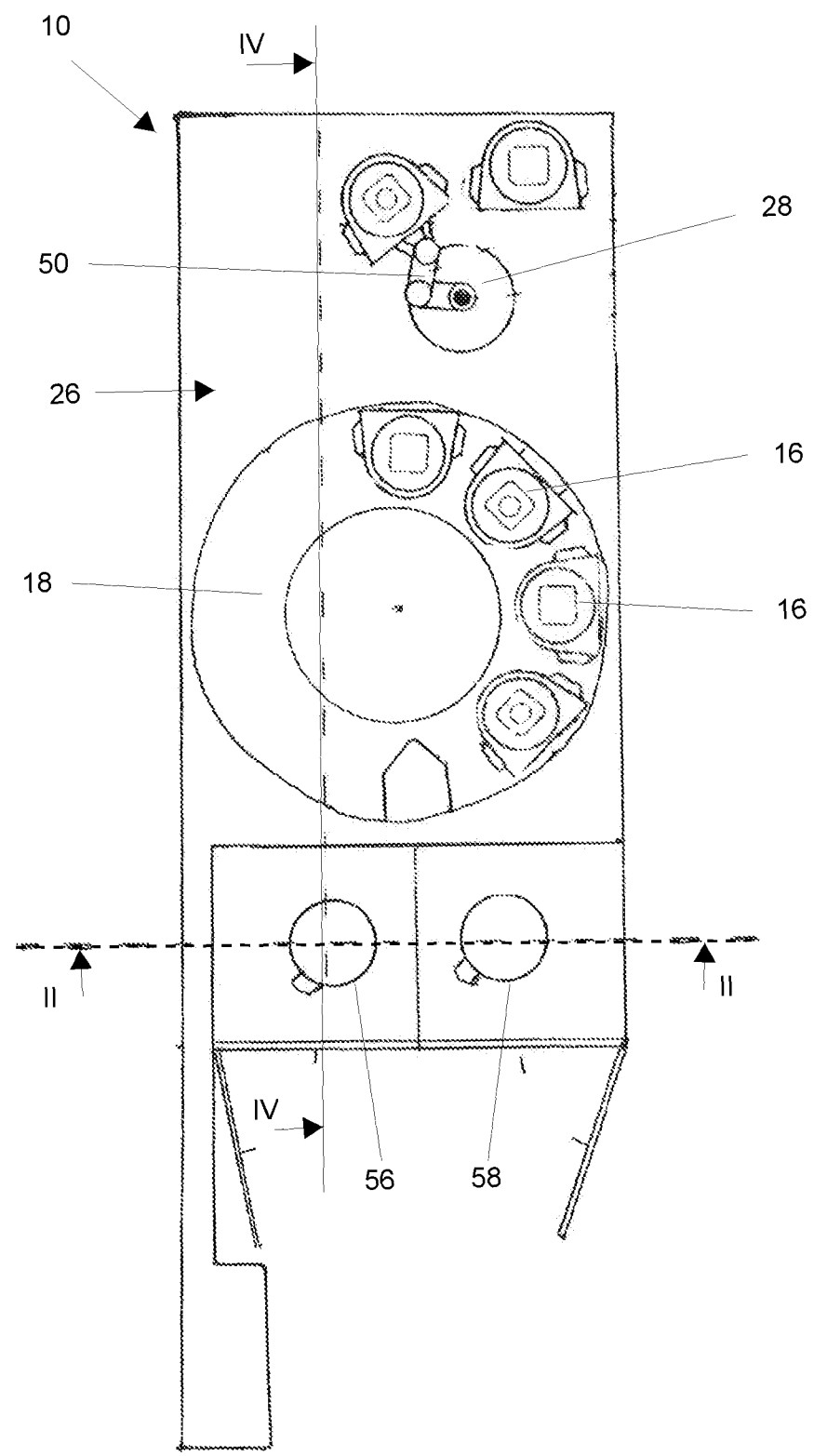
FIG. 3 shows a schematic cross sectional top view of the example of FIG. 1, along the lines III in FIGS. 2 and 4; and, FIG. 4 shows a schematic cross section of the example of FIG. 1, along the lines IV in FIGS. 1, 2, and 3.
Figure 4:
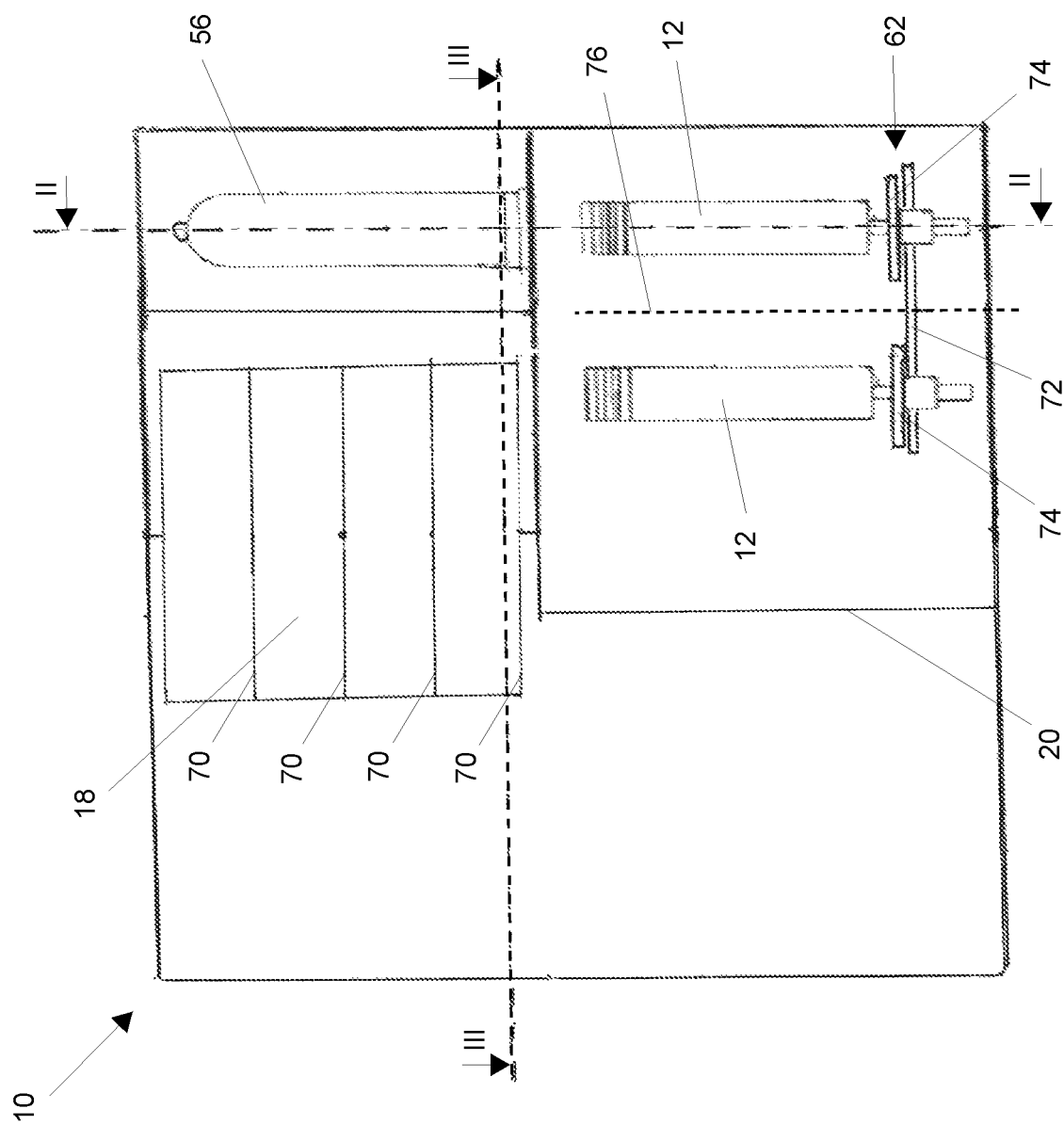

In the most general terms the present disclosure provides a vertical batch furnace assembly 10 for processing wafers, of which an example is shown in FIGS. 1-4. The vertical batch furnace assembly 10 may comprise a cassette handling space 26. The cassette handling space 26 may be provided with a cassette storage configured to store a plurality of wafer cassettes 16 provided with a plurality of wafers. The cassette handling space 26 may be provided with a cassette handler 28 configured to transfer wafer cassettes 16 between the cassette storage and a wafer transfer position 24. The vertical batch furnace assembly 10 may comprise a wafer handling space 30. The wafer handling space 30 may be provided with a wafer handler 32 configured to transfer wafers between a wafer cassette 16 in the wafer transfer position 24 and a wafer boat 12 in a wafer boat transfer position 34.

The vertical batch furnace assembly 10 may comprise an internal wall 20 separating the cassette handling space 26 and the wafer handling space 30. The internal wall 20 may be provided with a wafer transfer opening 22 adjacent the wafer transfer position 24 for a wafer cassette 16 from or to which wafers are to be transferred. The cassette storage may comprise a cassette storage carousel 18 with a diameter between 1.1 and 1.6 meter.

The effects and advantages of the vertical batch furnace assembly 10 have been described in the summary section and these effects and advantages are inserted here by reference.

In an embodiment the cassette storage carousel 18 may have at least one platform stage 70. The cassette storage may have a storing capacity between 5 to 8 wafer cassettes 16 per platform stage 70. For example the cassette storage carousel 18 may have a diameter of about 1.1 to 1.2 meter to have a storing capacity of 5 wafer cassettes 19 per platform stage 70. In another example the cassette storage carousel 18 may have a diameter of about 1.3 to 1.5 meter to have a storing capacity of 6 wafer cassettes 16 per platform stage 70. Or as shown in FIG. 7 the cassette storage carousel 18 may have a diameter of about 1.4 to 1.6 meter to have a storing capacity of about 8 wafer cassettes 16 per platform stage 70 of which 4 wafer cassettes 16 are shown.

In an embodiment the vertical batch furnace assembly 10 may be provided with a substantially rectangular footprint having two opposite short sides defining a width 36 of the vertical batch furnace assembly 10 and having two opposite long sides defining a length 38 of the vertical batch furnace assembly 10. The width 36 of the vertical batch furnace assembly 10 may be 1.65 meter or less.

By having a substantial rectangular footprint, multiple vertical batch furnace assemblies 10 can be arranged adjacent to each other, thus making optimal use of available floor area. Adjacent vertical batch furnace assemblies with rectangular footprints may have no unused space in between them. A width 36 of less than 1.65 meter is beneficial in view of interchangeability width vertical batch furnace assemblies of other manufacturers/brands.

In an embodiment the vertical batch furnace assembly 10 may further comprise a first process chamber 56 for processing wafers accommodated in a wafer boat 12. The vertical batch furnace assembly 10 may further comprise a second process chamber 58 for processing wafers accommodated in a wafer boat 12. The vertical batch furnace assembly 10 may still further comprise a single wafer boat handling device 60.

The wafer boat handing device 60 may comprise one rotatable table 72 having a plurality of wafer boat support surfaces 74 each configured for supporting a wafer boat 12.

The rotatable table 72 may be rotatable by an actuator around a central substantially vertical axis 76. The rotatable table 72 may be rotatable to transfer each wafer boat support surface 74 to a first wafer boat load/receive position 62 in which the wafer boat handling device 60 is configured to load a wafer boat 12 vertically from the rotatable table 72 into the first process chamber 56 and to receive the wafer boat 12 from the first process chamber 56 onto the rotatable table 72. The rotatable table 72 may also be rotatable to transfer each wafer boat support surface 74 to a second wafer boat load/receive position 64 in which the wafer boat handling device 60 is configured to load the wafer boat 12 vertically from the rotatable table 72 into the second process chamber 58 and to receive the wafer boat 12 from the second process chamber 58 onto the rotatable table 72. The wafer boat handling device 60 may comprise a first wafer boat lift assembly 78 configured to transfer a wafer boat 12 between the first wafer boat load/receive position 62 and the first process chamber 56. The wafer boat handling device 60 may also comprise a second wafer boat lift assembly 78' configured to transfer a wafer boat 12 between the second wafer boat load/receive position 64 and the second process chamber 58. The rotatable table 72 may further be rotatable to transfer each wafer boat support surface 74 to a cooldown position 80 in which the wafer boat handling device 60 is configured to cool down the wafer boat 12. The rotatable table 72 may also be rotatable to transfer each wafer boat support surface 74 to an intermediate position 82. A boat transfer mechanism 84 may be provided to transfer a wafer boat 12 which is on a wafer boat support surface 74 which is in the intermediate position 82 to the boat transfer position 34 and vice versa.

The single wafer boat handling device 60 may thus be configured to load a wafer boat 12 to both the first process chamber 56 and the second process chamber 58, and to receive the wafer boat 12 from both the first process chamber 56 and the second process chamber 58. By virtue of this configuration, the vertical batch furnace assembly 10 may load/receive the wafer boat 12 to/from the first process chamber 56 with the use of the wafer boat handling device 60, as well as the second process chamber 58. The vertical batch furnace assembly 10 therefore does not need a second wafer boat handling device 60 to load/receive a wafer boat 12 to/from the second process chamber 58. The space not needed to accommodate such a second wafer boat handling device 60 may be used to reduce a width 36 of the vertical batch furnace assembly 10.

In an embodiment the vertical batch furnace assembly 10 may further comprise at least one cassette in-out port 48. The at least one cassette in-out port 48 provides the entrance to and the exit from the vertical batch furnace assembly 10, for the exchange of wafer cassettes 16 between the vertical batch furnace assembly 10 and the outside world. The at least one cassette in-out port 48 may be provided in a wall 84 bounding the cassette handling space 26. Said wall 84 may be at or near the short side of the substantially rectangular footprint of the vertical batch furnace assembly 10. The cassette handler 28 may be configured to transfer wafer cassettes 16 between the cassette storage, the wafer transfer position 24, and the at least one cassette in-out port 48.

Such a cassette handler 28 can handle all of the wafer cassette transfers within the cassette handling space 26. This may provide an efficient and cost-effective way to transfer wafer cassettes.

In an embodiment the cassette handler 28 may be provided with a cassette handler arm 50, and an elevator mechanism 52 configured to reach wafer cassettes 16 at different vertical heights within the cassette storage.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this description are not necessarily all referring to the same embodiment.

Furthermore, it is noted that particular features, structures, or characteristics of one or more of the various embodiments which are described above may be used implemented independently from one another and may be combined in any suitable manner to form new, not explicitly described embodiments. The reference numbers used in the detailed description and the claims do not limit the description of the embodiments nor do they limit the claims. The reference numbers are solely used to clarify.

LEGEND

10—vertical batch furnace assembly
12—wafer boat
16—wafer cassette
18—cassette storage carousel
20—internal wall
22—wafer transfer opening
24—wafer transfer position
26—cassette handling space
28—cassette handler
30—wafer handling space
32—wafer handler
34—wafer boat transfer position
36—width (of the vertical batch furnace assembly)
38—length (of the vertical batch furnace assembly)
48—cassette in-out port
50—cassette handler arm
52—elevator mechanism
56—first process chamber
58—second process chamber
60—wafer boat handling device
62—first wafer boat load/receive position
64—second wafer boat load/receive position
70—platform stage
72—rotatable table
74—wafer boat support surface
76—central axis
78 and 78'—wafer boat lift assemblies
80—cool down position
82—intermediate position
84—wafer boat transfer mechanism

The invention claimed is:

1. A vertical batch furnace assembly for processing wafers comprising:
a cassette handling space provided with a cassette storage configured to store a plurality of wafer cassettes provided with a plurality of wafers and a cassette handler configured to transfer wafer cassettes between the cassette storage and a wafer transfer position;
a wafer handling space comprising a substantially rectangular shape and provided with a wafer handler configured to transfer wafers between a wafer cassette in the wafer transfer position and a wafer boat in a wafer boat transfer position; and
an internal wall separating the cassette handling space and the wafer handling space and provided with a wafer transfer opening adjacent the wafer transfer position for a wafer cassette from or to which wafers are to be transferred, wherein the cassette storage comprises a cassette storage carousel with a diameter between 1.1 and 1.6 meter;
a first process chamber for processing wafers accommodated in a wafer boat;
a second process chamber for processing wafers accommodated in a wafer boat; and
a single wafer boat handling device comprising one rotatable table having a plurality of wafer boat support surfaces each configured for supporting a wafer boat, wherein the rotatable table is rotatable by an actuator around a central substantially vertical axis to transfer each wafer boat support surface to:
a first wafer boat load/receive position in which the wafer boat handling device is configured to load a wafer boat vertically from the rotatable table into the first process chamber and to receive the wafer boat from the first process chamber onto the rotatable table; and
a second wafer boat load/receive position in which the wafer boat handling device is configured to load the wafer boat vertically from the rotatable table into the second process chamber and to receive the wafer boat from the second process chamber onto the rotatable table,
wherein the cassette storage carousel comprises a platform stage configured to accommodate 5 or more wafer cassettes,
wherein the vertical batch furnace assembly is provided with a substantially rectangular footprint having two opposite short sides defining a width of the vertical batch furnace assembly and having two opposite long sides defining a length of the vertical batch furnace assembly, wherein the width of the vertical batch furnace assembly is 1.65 meter or less, and
wherein the cassette handler is provided with a pivotable cassette handler arm and an elevator mechanism, the pivotable arm configured to reach wafer cassettes at different vertical heights within the cassette storage, and
wherein the cassette storage carousel is disposed between the elevator mechanism and the internal wall and there is no overlap of the elevator mechanism and the cassette storage carousel in a direction spanning between the two opposite short sides.

2. The vertical batch furnace assembly according to claim 1, wherein the cassette storage carousel comprises a plurality of platform stages of which one platform stage is the platform stage, and wherein each platform stage of the plurality of platform stages has a storing capacity of between 5 to 8 wafer cassettes per platform stage.

3. The vertical batch furnace assembly according to claim 2, wherein the cassette storage carousel has a diameter of about 1.1 to 1.2 meter and a storing capacity of 5 wafer cassettes per platform stage.

4. The vertical batch furnace assembly according to claim 2, wherein the cassette storage carousel has a diameter of about 1.3 to 1.5 meter and a storing capacity of 6 wafer cassettes per platform stage.

5. The vertical batch furnace assembly according to claim 2, wherein the cassette storage carousel has a diameter of about 1.4 to 1.6 meter and a storing capacity of about 8 wafer cassettes per platform stage.

6. The vertical batch furnace assembly according to claim 1, wherein the wafer boat handling device comprises a first wafer boat lift assembly configured to transfer a wafer boat between the first wafer boat load/receive position and the first process chamber.

7. The vertical batch furnace assembly according to claim 1, wherein the wafer boat handling device comprises a second wafer boat lift assembly configured to transfer a wafer boat between the second wafer boat load/receive position and the second process chamber.

8. The vertical batch furnace assembly according to claim 1, wherein the rotatable table is rotatable to transfer each wafer boat support surface also to:

a cooldown position in which the wafer boat handling device is configured to cool down the wafer boat.

9. The vertical batch furnace assembly according to claim 1, wherein the rotatable table is rotatable to transfer each wafer boat support surface also to an intermediate wafer boat position, wherein the vertical batch furnace assembly additionally comprises a boat transfer mechanism configured to transfer a wafer boat which is on a wafer boat support surface which is in the intermediate position to the boat transfer position and vice versa.

10. The vertical batch furnace assembly according claim 1, further comprising at least one cassette in-out port provided in a wall bounding the cassette handling space, wherein the cassette handler is configured to transfer wafer cassettes between the cassette storage, the wafer transfer position and the at least one cassette in-out port.

11. The vertical batch furnace assembly according to claim 1, wherein the diameter is substantially a width of the substantially rectangular shape.

* * * * *